United States Patent
More

Patent Number: 6,046,402
Date of Patent: Apr. 4, 2000

[54] SOLAR HYBRID ELECTRICAL POWERING DEVICES FOR PULSE DISCHARGE APPLICATIONS

[75] Inventor: Georgina More, Duluth, Ga.

[73] Assignee: Motorola, Inc., Schaumburg, Ill.

[21] Appl. No.: 09/083,075

[22] Filed: May 21, 1998

[51] Int. Cl.[7] ................................................ H01L 25/00
[52] U.S. Cl. ........................ 136/248; 136/293; 320/101; 320/166
[58] Field of Search .................... 136/248, 293; 320/101, 166

[56] References Cited

U.S. PATENT DOCUMENTS

| | | | |
|---|---|---|---|
| 4,634,953 | 1/1987 | Shoji et al. | 136/293 |
| 4,959,603 | 9/1990 | Yamamoto et al. | 136/293 |
| 5,747,967 | 5/1998 | Muljadi et al. | 136/293 |

OTHER PUBLICATIONS

Derwnt Abtract 1997–138479 (corresponds to JP 09018026), Jan. 17, 1997.

*Primary Examiner*—Mark Chapman
*Attorney, Agent, or Firm*—Felipe J. Farley; Philip H. Borrus, IV

[57] ABSTRACT

A device for powering electrical digital pulse discharge applications comprises one or more solar energy conversion modules and a load-leveling circuit that is comprised of at least one capacitor.

4 Claims, 4 Drawing Sheets

SOLAR HYBRID ELECTRICAL POWERING DEVICES FOR PULSE DISCHARGE APPLICATIONS

TECHNICAL FIELD

This invention relates in general to energy conversion devices, and in particular to methods of amplifying the available discharge current of solar devices for digital pulse discharge applications.

BACKGROUND OF THE INVENTION

As electronic devices increasingly become portable, advances must be made in energy storage systems and energy conversion devices to enable such portability. Indeed, it is often the case with current electronic technology that the limiting factor to portability of a given device is the size and the weight of the associated energy storage device. A small energy storage device, such as a battery, may be fabricated for a given electrical device but at the cost of energy capacity. Conversely, an energy source with long operating time between recharging can be built, but it is often too large or too bulky to be comfortably portable. The result is that the energy source is either too heavy or does not last long enough for a particular user's application.

Numerous different battery systems have been proposed for use over the years. Early rechargeable battery systems included lead acid, and nickel cadmium (Ni-Cd), each of which has enjoyed considerable success in the market place. Lead acid batteries are preferred for applications in which ruggedness and durability are required and hence have been the choice of automotive and heavy industrial settings. Conversely, Ni-Cd batteries have been preferred for smaller portable applications. More recently, nickel metal hydride systems (NiMH) have found increasing acceptance for both large and small applications. Still other new secondary batteries have appeared with high voltage, low weight, high energy density, and long duty life, particularly the lithium ion rechargeable cells.

Notwithstanding the success of the foregoing secondary battery systems, the greatest demand for these battery systems is in applications where the battery must be able to be recharged repeatedly and safely. For traveling end-users, especially in remote areas or marine locations, it is not always feasible to find an electrical outlet to recharge the battery. Replacement costs of batteries and a paucity of retail battery outlets may make it impractical to replace the transmitters. Even where local power sources are available, some travelers have found it necessary to carry a variety of battery chargers to accommodate differences in voltage, amperage, and frequency in various parts of the globe.

One solution to the difficulty of recharging batteries in remote locations or where rechargeability is not practical would be to replace or supplement the battery pack with a photovoltaic or solar energy conversion device. With this solution, the user then has a portable "power plant" and can thus minimize his or her dependence on "plug in" power. Solar power is considered to be an environmentally clean technology, and the energy, as long as there is sunlight, is essentially free for the taking. Also, photovoltaic modules enjoy a reputation for a long working life, and thus may last the useful life of the portable equipment in which they are employed.

Photovoltaic efficiencies of conversion into electrical energy for best commercially available cells today are at 17% conversion. Ideally, for instance, a 1-cm$^2$ single crystalline silicon cell (i.e., the most efficient variety) may provide around 35 mA current under full sun (direct sun at noon on a bright summer day). In reality because of efficiency losses, the realized current is much lower. Of the commercially available photovoltaic cells, single crystalline silicon cells are the most efficient, followed by polycrystalline, and then amorphous. The use of solar cells are intended for applications where sunlight is readily available. Under conditions of low light intensity the use of solar cells is simply not suitable.

In some portable communications, a portable solar module may provide the required current where current drain requirement is low. However, digital technology, which is a fast growing market and the prevalent profile for many of the new communication products, requires high current drains under the pulse discharge.

For digital transmission applications with their typically high pulse drain currents, a solar module of the conventional type used today would need to be impracticably large.

Accordingly, there exists a need for solar powering devices capable of high current outputs.

DETAILED DESCRIPTION OF THE PREFERRED EMBODIMENT

The invention is a device for powering electrical digital pulse discharge applications: it comprises one or more solar modules in combination with a load-leveling circuit that is comprised of at least one capacitor. Photovoltaic modules are connected in parallel to electrochemical capacitors making a hybrid energy conversion device that can operate digital communications equipment without the use of batteries. This advance couples the power burst characteristics of capacitors with the constant energy conversion characteristics of solar collection panels. Each electrical pulse demanded by a digital output application is typically drawn as a high current burst of discrete incremental duration followed by a standby interval of much larger duration.

An appropriate combination of solar cells as well as capacitors would be used to provide a voltage slightly higher than the operating voltage of the digital phone/radio. The capacitor or capacitors provide the current during the discharge pulse while the solar modules provide the current for charging the capacitor as well as for the standby current during the delay period. The solar/capacitor hybrid device would in fact provide the energy for operating the portable phone.

Figure 1:
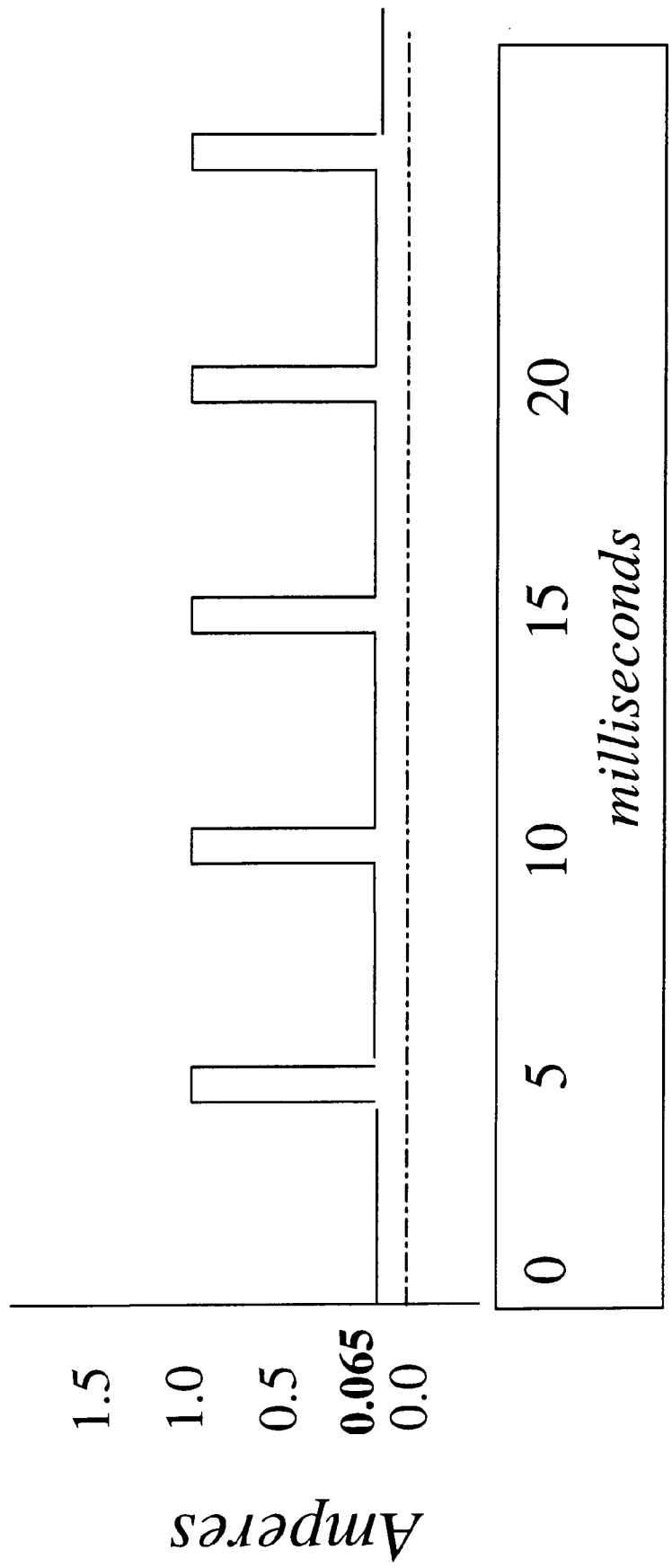
FIG. 1 is a schematic representation of a GSM radio frequency telecommunication digital pulse profile.
Figure 2:
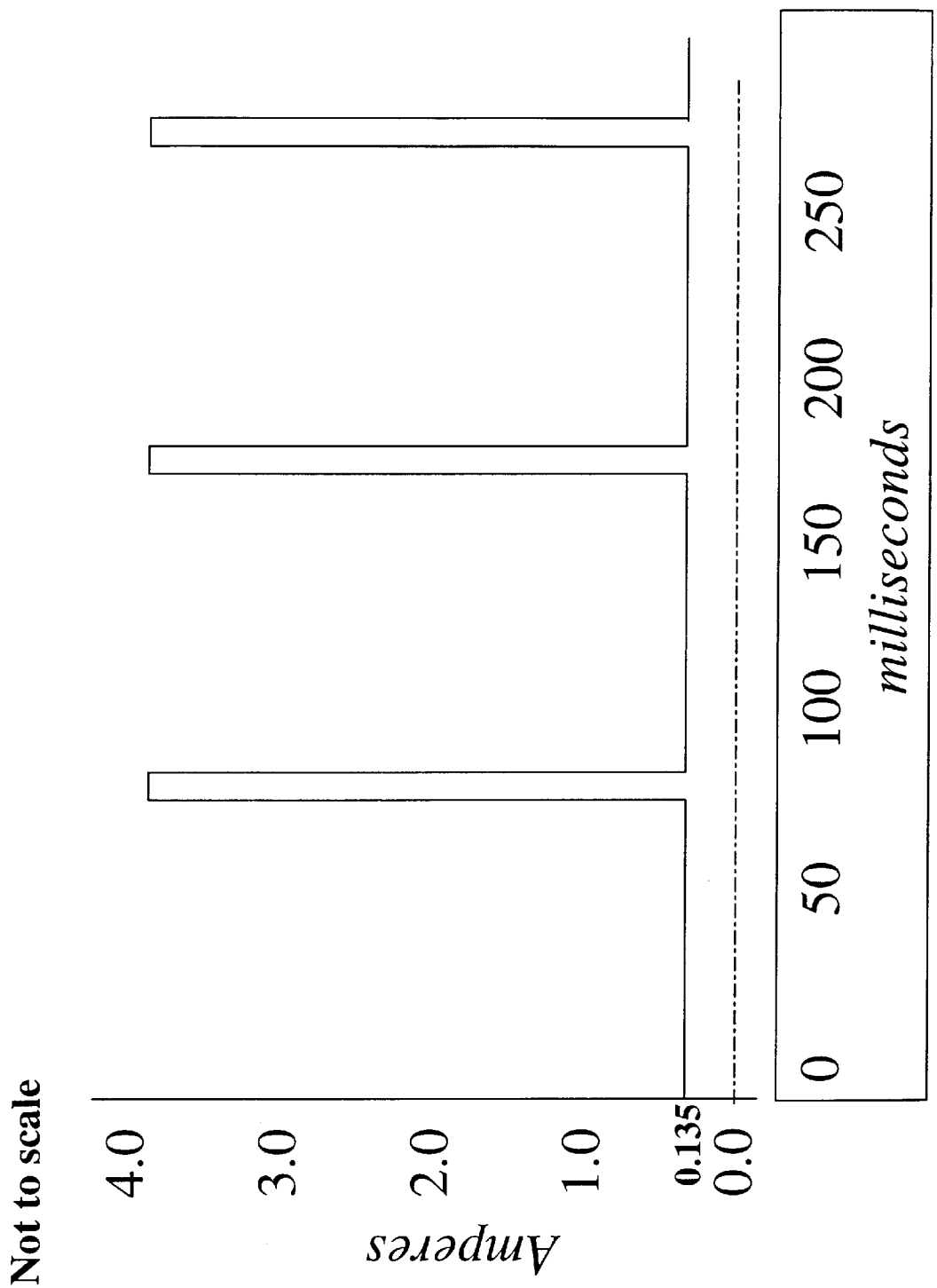
FIG. 2 is a schematic representation of an Iridium satellite radio frequency telecommunication digital pulse profile.
Figure 3:
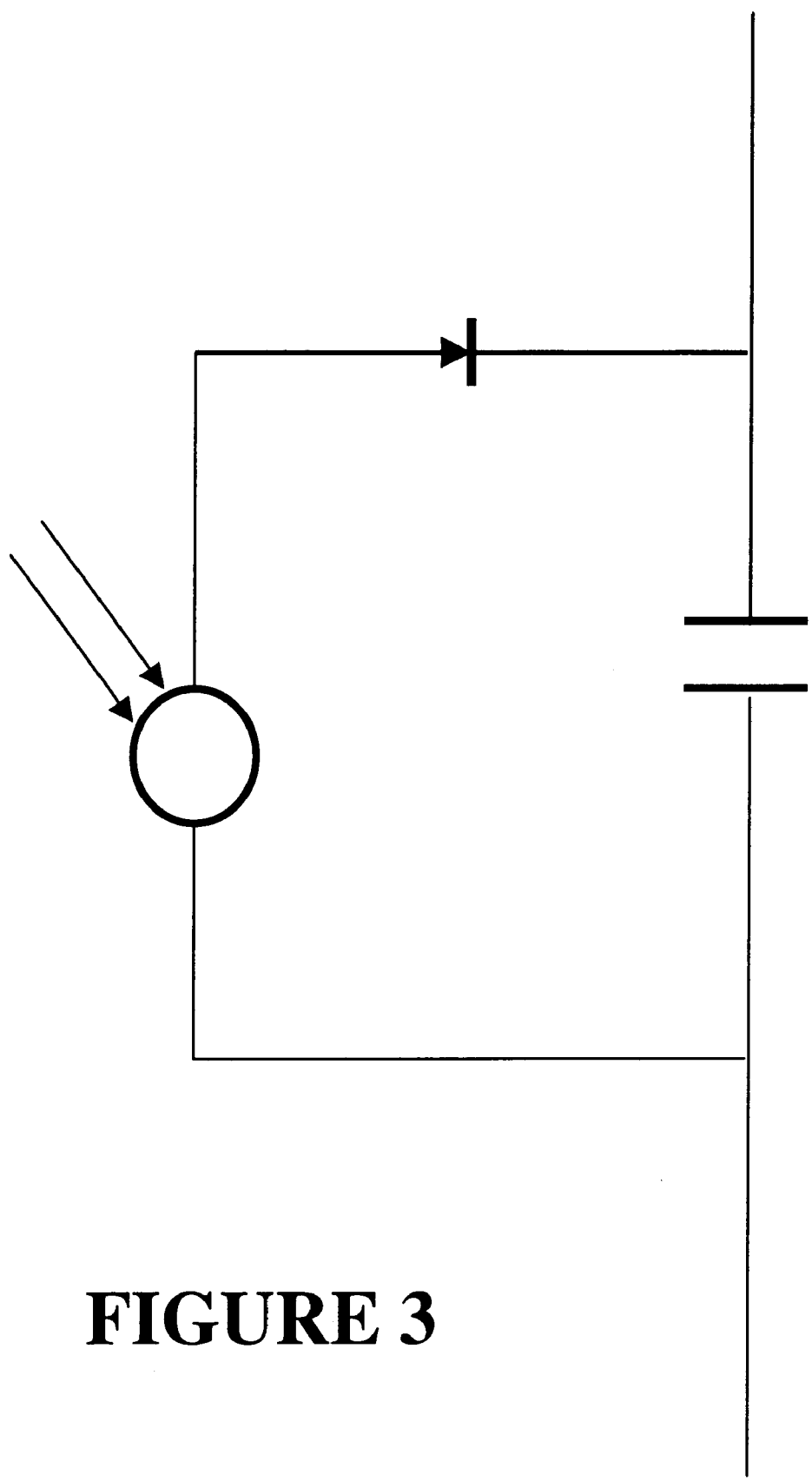
FIG. 3 is a schematic representation of a circuit incorporating the present invention.
Figure 4:
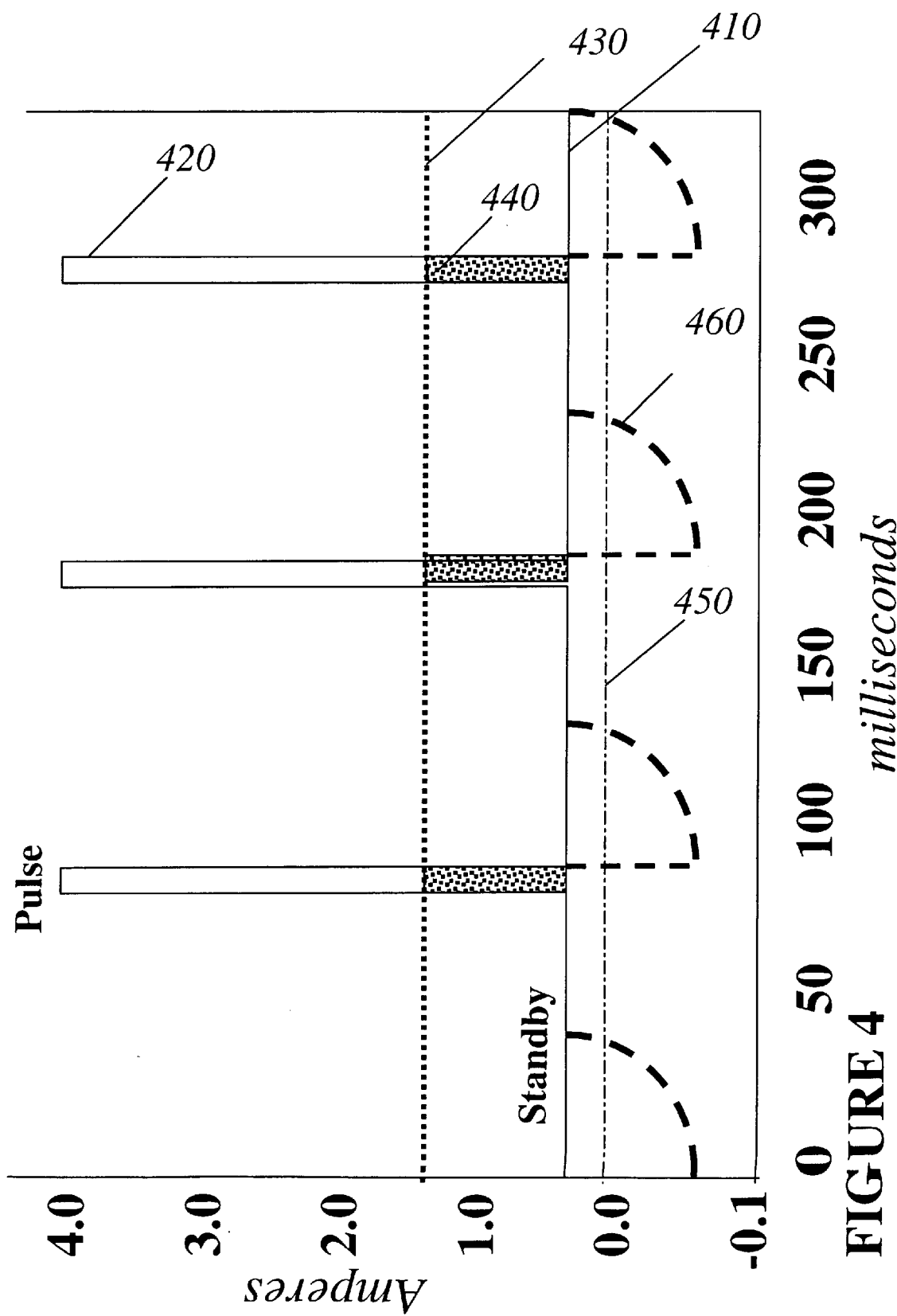
FIG. 4 is a schematic representation of a telecommunication digital pulse discharge profile (410 and 420) superimposed on profiles of output and input currents carried by a solar module and a capacitor in parallel electrically according to the present invention. The standby phase of the profile is illustrated by a horizontal solid line in the digital discharge profile (410). The dotted line (430) represents output capability from the solar module under operating conditions: stippled blocks (440) represent the solar module's capability to contribute to the power spike demanded by the device. The unshaded blocks (420) represent the contribution of the discharging capacitor to the power spike demanded by the digital device. The intermittent dash horizontal line (450) represents zero current baseline. The dashed lines (460) represent the capacitor re-charging cycle. The electrical current from the solar module that is not used either to supply a fraction of a power spike directly or to recharge the capacitor is drained off or is cut off by a switch.

For instance, a GSM standard for radio frequency telecommunications devices specifies bursts of 1-ampere magnitude for 0.55 millisecond, followed by 0.065 amperes during standby for 4 milliseconds (illustrated in FIG. 1). Another example is that for the Iridium satellite communications system, which specifies under peak power conditions bursts up to 4-ampere for approximately 8.2 milliseconds, followed by 0.135 amperes during 81.8 millisecond standby periods within the 90 millisecond cycle (illustrated in FIG. 2). If this power were supplied by solar module alone, the solar unit would have to be able to supply constantly at least the currents needed at peak demand. However, by coupling it with a capacitor, the solar unit may be a fraction of the size needed to supply the peak current densities. Thus the solar module supplies a steady current, while the capacitor (or bank of capacitors) accommodates spikes in the output and can be recharged at a rate that is a small fraction of the discharge rate. Therefore from the perspective of demand on the solar unit, the capacitor provides a load-leveling effect. And thus a photovoltaic module and capacitor hybrid can power a host device that requires several times the nominal maximum photovoltaic current output. Battery use is optional and will not be required for operation of the communication equipment. The invention includes the incorporation of such an instantaneous power generator in a digital electrical output apparatus.

There are many types of pulse-emitting digital circuits, such as radio frequency pulse-emitting circuits, visible light pulse-emitting circuits, ultra-violet pulse-emitting circuits, infrared pulse-emitting circuits, microwave pulse-emitting circuits, X-ray pulse-emitting circuits, gamma ray pulse-emitting circuits, electron pulse-emitting circuits, ion-pulse-emitting circuits, and combinations thereof. Each of these have peak pulse power-demand requirements that may be understood by analogy with the pulse profiles of digital telecommunications devices.

Considering now the solar power modules for electrical circuits, the most efficient photo-energy conversion modules contain monocrystalline silicon cells, though one can also employ polycrystalline silicon cells or amorphous silicon cells without departing from the spirit of the invention. In addition, other solar conversion chemistries have been employed, such as those based on metal chalcogenides such as titanium dioxide. Alternatively, biomimetic solar cells based on the principle of photoexcitation of porphyrin derivatives or other organic molecules have been employed, as have cells based on photoconducting polymers (i.e., polymers that become intrinsically electrically conductive upon excitation by light). In each of these cases the low relative rate of energy generation makes the present invention valuable in amplifying the available electrical output for a circuit.

A variety of capacitor types suit the purpose of the invention, including electrochemical capacitors, electrolytic capacitors, ceramic capacitors, film capacitors, mica capacitors, paper-foil-filled capacitors, and combinations thereof. The apparent storage capacity of the capacitor can be amplified by a circuit such as in the manner described in U.S. Pat. Ser. No. 5,714,863.

Not only the rate of power draw but also its degree of responsiveness in switching between on and off modes is critical in generating digital signals. The choice of capacitor type is guided by the response rate and maximum inductance demanded by the digital circuit for which the capacitor is employed, as well as by the cycle life expected of the capacitor. In addition, the circuit configuration must be able to satisfy the voltage requirements of the portable digital equipment, and the capacitor must of course have sufficient capacity to provide the portion of the power burst that the solar module is incapable of generating.

The relationship between the capacitor characteristics and the solar module characteristics can be further summarized by the following equation relating them to the pulse width and standby time between signals:

$$\frac{\text{Standby Time}}{\text{Pulse Time}} \geq \frac{\text{Peak Capacitor Current}}{\text{Solar Operating Current}}$$

EXAMPLE 1

Two 10 V, 0.9 mF capacitors were connected in parallel to obtain 1.8 mF, 10 V; a single 2 mF, 10 V capacitor could have been employed instead. Overall impedance was about 45 mΩ for the block of capacitors, or 90 mΩ for each of the individual capacitors. The GSM profile used had a 217-Hertz frequency. Single crystalline solar cells with a theoretical capability of 35 mA/cm2 under one full sun can be used for the solar module. Each of said solar cells provides 0.55 V: to meet the 6 V requirement for MicroTAC™ cellular telephone use, eleven (11) solar cells are required. This corresponds to 110 cm$^2$ or 17 square inches of solar collection surface area to provide 360 mA current, which is satisfactory for the analog version of the MicroTAC™ cellular telephone (for production designs the solar collection panel would be somewhat larger than 110 cm$^2$ in order to accommodate less bright conditions). However, for the digital version of the MicroTAC™ cellular telephone, the solar array alone cannot provide the 1.02 A pulse needed by its profile. Standby current is 65 mA for the digital profile, resulting in an average current of approximately 180 mA for the application. The 110 cm$^2$ solar module for the analog application would provide more than enough current for standby current as well as for recharging the capacitor. The minimum real estate required for the application could be optimized and a smaller size module may be used. Electrolytic capacitors manufactured by Nichicom™ and Teapom ™ are suitable for the current requirements of this GSM application.

EXAMPLE 2

In the Iridium application, the pulse frequency is 11 Hertz; pulses are on the order of 4 amperes. In this example, an electrochemical capacitor is employed because at 4 A current, to use electrolytic capacitors as in the example above would require much larger electrolytic capacitors, which would be an undesirable choice for designing portable electronics.

The electrochemical capacitors that were employed are developmental prototypes obtained from Danionics™, Maxwell™, and Pinnacle™. Three of these developmental electrochemical capacitors were connected in series to obtain ca. 40–50 mF: each was a 3 V capacitor, thus the series voltage was 9 V. Impedance was specified at about 50 mΩ. There are several pulse profiles for Iridium systems: one of the most stringent requires 4 A pulses, standby current of about 135 mA, and average current is 460 mA (i.e., time-averaged current including both the pulse and standby (or delay) phase is 460 mA. Again the solar array must provide at least the average current requirement for the application: from the values cited in Example 1 it will be seen that this module requires 140 cm$^2$ (i.e., 14 single-crystalline silicon solar cells, or a collection surface of 22 inch$^2$) to provide the standby current as well as charging the electrochemical capacitor (though as noted in the first example the solar collection panel for commercial devices would be somewhat larger to accommodate non-ideal lighting conditions). Optimum size and shape of the solar module and capacitor device vary according to product design and cosmetic requirements.

It will be appreciated by now that there has been provided an improved energy conversion device for powering applications with high pulse current demands. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A portable communication device which includes a digital circuit, selected from the group consisting of cellular telephone and radios, wherein the portable communication device is directly powered by a hybrid powering device comprised of:

a solar energy conversion module; and a capacitor in parallel electrically to said solar energy conversion module in an electrical circuit.

2. A portable communication device as described in claim 1, wherein said solar energy conversion module is selected from the group consisting of monocrystalline silicon cells, polycrystalline silicon cells, amorphous silicon cells, metal chalcogenide cells, biomimetic solar cells, photoconducting polymer cells, and combinations thereof.

3. A portable communication device as described in claim 1, wherein said capacitor is selected from the group consisting of electrochemical capacitors, electrolytic capacitors, ceramic capacitors, film capacitors, mica capacitors, paper-foil-filled capacitors, high-rate microbatteries, and combinations thereof.

4. A portable communication device as described in claim 1, wherein said digital circuit is selected from the group consisting of radiofrequency pulse-emitting circuits, visible light pulse-emitting circuits, ultra-violet pulse-emitting circuits, infrared pulse-emitting circuits, microwave pulse-emitting circuits, X-ray pulse-emitting circuits, gamma ray pulse-emitting circuits, electron pulse-emitting circuits, ion-pulse-emitting circuits, and combinations thereof.

* * * * *

UNITED STATES PATENT AND TRADEMARK OFFICE
CERTIFICATE OF CORRECTION

PATENT NO : 6,046,402
DATED : April 4, 2000
INVENTOR(S) : More, Georgina

It is certified that error appears in the above-identified patent and that said Letters Patent is hereby corrected as shown below:

Attorney, Agent or Firm line reads, "Felipe J. Farley; Philip H. Borrus, IV" should be--Felipe J. Farley; Philip H. Burrus, IV--.

Signed and Sealed this

Sixth Day of February, 2001

Attest:

Attesting Officer

Q. TODD DICKINSON
Director of Patents and Trademarks